(12) United States Patent
Brand

(10) Patent No.: US 7,355,217 B1
(45) Date of Patent: Apr. 8, 2008

(54) MOS TRANSISTOR STRUCTURE WITH EASY ACCESS TO ALL NODES

(75) Inventor: Joerg Brand, Fuerstenfeldbruck (DE)

(73) Assignee: National Semiconductor Corporation, Santa Clara, CA (US)

( * ) Notice: Subject to any disclaimer, the term of this patent is extended or adjusted under 35 U.S.C. 154(b) by 46 days.

(21) Appl. No.: 11/285,764

(22) Filed: Nov. 22, 2005

(51) Int. Cl.
*H01L 27/10* (2006.01)

(52) U.S. Cl. .................. 257/202; 257/208; 257/211; 257/E27.108

(58) Field of Classification Search ........... 257/202, 257/204, 206, 208, 211, E27.108; 716/5, 716/11, 12, 17
See application file for complete search history.

(56) References Cited

U.S. PATENT DOCUMENTS 4,636,825 A * 1/1987 Baynes .................. 257/401
5,447,876 A * 9/1995 Moyer et al. ............ 438/105
2003/0054614 A1 * 3/2003 Trivedi et al. ........... 438/289

* cited by examiner

*Primary Examiner*—Minh-Loan T Tran
(74) *Attorney, Agent, or Firm*—Darby & Darby PC; Matthew M. Gaffney

(57) ABSTRACT

A transistor device structured such that the bulk, gate, drain, and source are all accessible from all four edges of the device is provided. The transistor is created with a four-metal CMOS process. A bulk connection can be made with Metal 1, which is all around the device. A gate connection can be made with Metal 2, which is all around the device. Additionally, a drain/source connection can be made with Metal 3, which is all around the device. A source/drain connection can be made with Metal 4, which is all around the device. The transistor structure may be used to create an array of transistors for a high power output stage, with the transistors arranged in a checkerboard pattern. The connections of each transistor are automatic by abutting edges of the transistors.

27 Claims, 16 Drawing Sheets

US 7,355,217 B1

MOS TRANSISTOR STRUCTURE WITH EASY ACCESS TO ALL NODES

FIELD OF THE INVENTION

The invention is related to transistors, and in particular, to a transistor structure suitable for use in a linear regulator on an integrated circuit including an array of output transistors in which the source, drain, gate, and bulk of each of the output transistors in the array is accessible from all four edges of the transistor.

BACKGROUND OF THE INVENTION

A linear regulator typically operates to provide a regulated output voltage from an input voltage. A linear regulator includes a pass transistor to provide the regulated output voltage from the input voltage, where the base or gate of the pass transistor is adjusted through negative feedback to regulate the output voltage.

BRIEF DESCRIPTION OF THE DRAWINGS

Non-limiting and non-exhaustive embodiments of the present invention are described with reference to the following drawings, in which.

DETAILED DESCRIPTION

Figure 1:
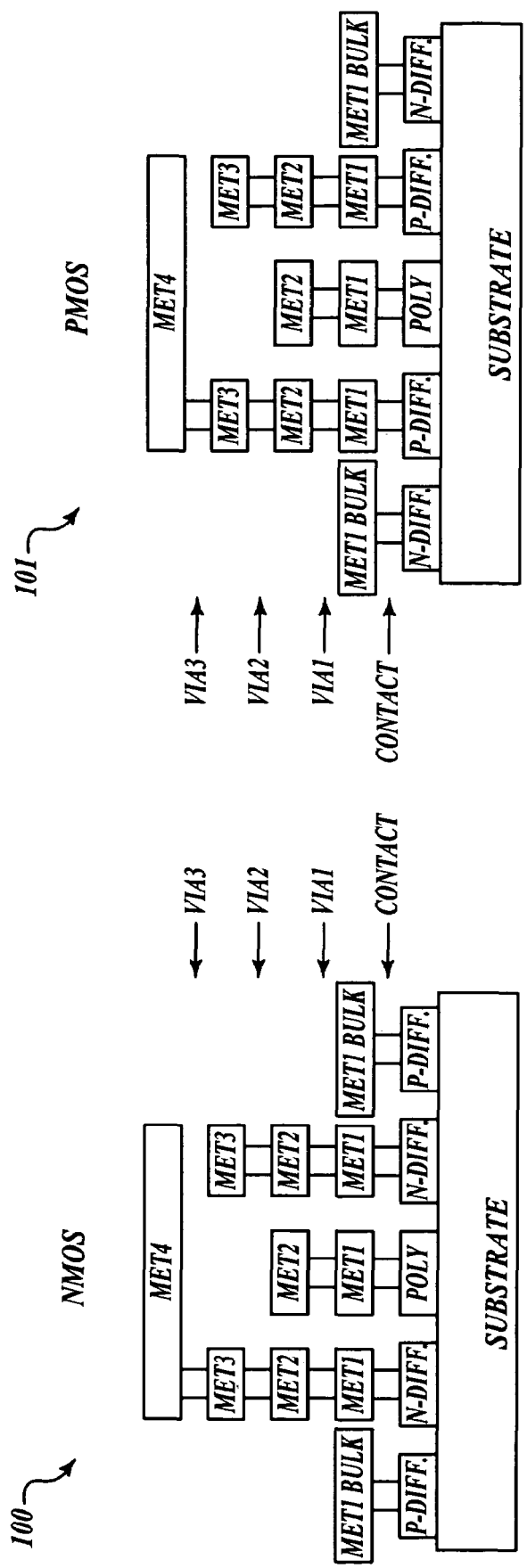
FIG. 1A illustrates a diagram of a cross-sectional view of an embodiment of an NMOS transistor.
FIG. 1B illustrates a diagram of a cross-sectional view of an embodiment of a PMOS transistor.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal.

Briefly stated, the invention is related to a transistor device structured such that the bulk, gate, drain, and source are all accessible from all four edges of the device. The transistor is created with a four-metal CMOS process. A bulk connection can be made with Metal 1, which is all around the device. A gate connection can be made with Metal 2, which is all around the device. Additionally, a drain/source connection can be made with Metal 3, which is all around the device. A source/drain connection can be made with Metal 4, which is all around the device. The transistor structure may be used to create an array of transistors for a high power output stage, with the transistors arranged in a checkerboard pattern. The connections of each transistor are automatic by abutting edges of the transistors.

FIG. 1A illustrates a diagram of a cross-sectional view of an embodiment of NMOS transistor 100. Transistor 100 may include a substrate, two n-type diffusion regions (N-Diff) employable as the drain and source, a polysilicon region (Poly) for the gate connection, an insulator such as silicon dioxide separating Poly from the substrate (not shown), a p-type diffusion region (P-Diff) for the bulk connection, four metal layers Metal 1 (Met1) through Metal 4 (Met4), metal contacts from the silicon to Metal 1, and three vias Via1 through Via3 connecting the four Metal regions Met1-Met4 together. In one embodiment, transistor 100 is laid out in a CMOS process and parametric cell generation is employed.

NMOS transistor 100 may have a p-type substrate, such as p-type silicon. The two n-type diffusion regions N-Diff are interchangeably usable as drain and source regions. The semiconductor region between the two N-Diff regions is the channel region of the transistor. Also, Poly may be connected to the channel region through an insulator (such as silicon dioxide) that separates Poly from the channel region.

Although not visible in this two-dimensional, cross-section view, each of the four metal layers covers all four edges of the device rectangle. The bulk connection surrounds the transistor and is accessible in Met1. No other layer is needed to connect the bulk.

The gate connection is accessible in Met2. The Met2 connection surrounds the whole structure. As previously stated, the drain and source are interchangeable. For ease is discussion, it will be assumed from hereon that Met3 is used for the drain connection and Met4 is used for the source connection. However, it is understood that, alternatively, Met4 may be used for the drain connection and Met3 for the source connection. In one embodiment, Met3 is a slotted plate over the whole device. The slots are provided because of the connection to Met4, which is the source (assuming that the drain is on the Met3 plate).

The Via3s are connected to the Met3 paths, which are located in the slots of the Met3 plate to connect to the source on the Met4 plate (assuming that drain is on the Met3 plate). The Met4 plate is the top plate of the device and covers the whole transistor.

Met1, Met2, Met3, and Met4 all cover each of the four edges of the device rectangle. However, throughout the specification and the claims, the phrase "cover each of the four edges of the device rectangle" does not mean that the Met2, Met3, and Met 4 rings overlap the bulk ring completely. In one embodiment, the Met2 ring, the Met3 and Met4 plates are overlapping the bulk ring on Met1 by 50 percent. If the metal layer includes a ring that overlaps part of the bulk ring, that is sufficient to meet the condition that the metal layers "cover each of the four edges of the device rectangle". On any edge in which a node is coupled to a corresponding node of the transistor, the metal layer of the corresponding edge overlapped the bulk by 100% so that the metal layers of each of the two transistors are connected together to form one plate. However, for any edge in which there is no other transistor to connect to, in one embodiment, the Met2, Met3, and Met4 rings only overlap the bulk ring by 50% on that side, in one embodiment.

If an array of the transistors is created, the layout designer has to abut the Met2, Met3, and Met4 only. This results in an automatic interconnection between all nodes on all affected transistors.

Although one embodiment of NMOS transistor 100 is illustrated in FIG. 1, other embodiments are within the scope of the invention. For example, in one embodiment, Poly may be replaced with a conductor other than polysilicon, such as metal.

Also, the embodiment described above assumes an application for which it is desirable to have all four nodes (source, drain, gate, and bulk) accessible from all four edges of the device rectangle. In this embodiment, all four metal layers cover all four edges of the device rectangle. However, in other embodiments, this need not be the case. For example, in one embodiment, Met3 and Met4 cover all four device edges, but Met2 does not. In this example, the drain and source nodes are accessible from all four edges, but the gate node is not accessible from all four edges.

In one embodiment, four metal layers are employed, allowing independent connection to all four nodes, the drain, source, gate, and substrate. This embodiment allows isolation of substrate and back-biasing to improve leakage characteristics during off times.

However, although four metal layers are illustrated in FIG. 1A, in other embodiments, more or less than four metal layers may be used. For example, for the embodiment illustrated in FIG. 1A, the bulk node is independently accessible from the source node and may be driven to a different potential than the source node. In another embodiment, only three metal layers are used, in which layer Met1 is excluded. In this embodiment, the bulk node is not independently accessible.

In another embodiment, five or more metal layers may be employed.

FIG. 1 illustrates a p-type substrate. However, in other embodiments, an n-type substrate with a p-type well may be employed. Also, FIG. 1 illustrates an embodiment of transistor 100 which is a MOS transistor. However, in other embodiments, other types of field effect transistors (such as MESFETs, JFETs, or the like) may be employed. These variations and others are within the scope and spirit of the invention.

Further, although an n-type transistor is illustrated in FIG. 1A, p-type transistors may be employed in other embodiments, as illustrated in FIG. 1B.

FIG. 1B illustrates a diagram of a cross-sectional view of an embodiment of PMOS transistor 101.

Figure 2:
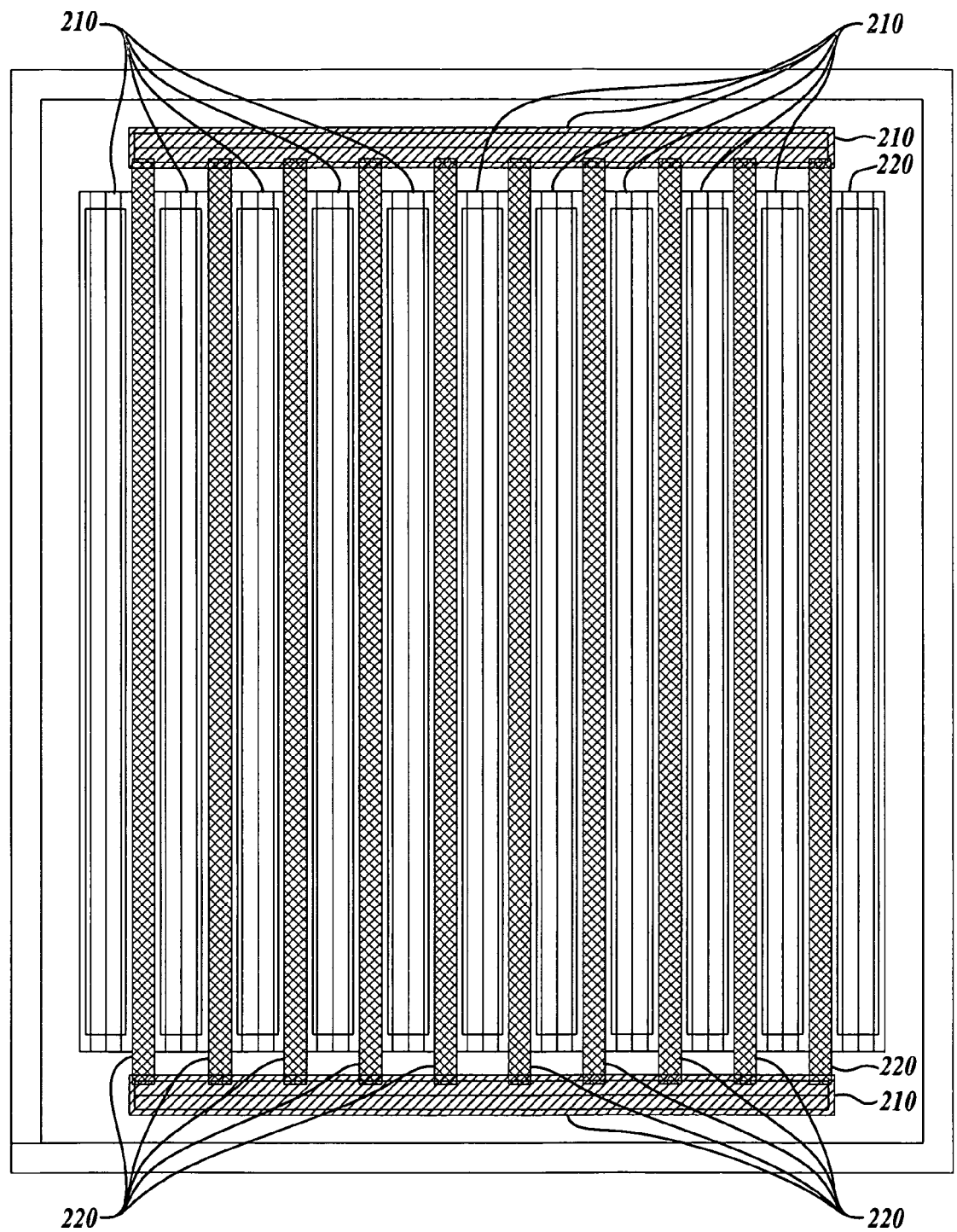
FIG. 2 shows a diagram of an embodiment of the Metal 1 and polysilicon for an embodiment of the NMOS transistor of FIG. 1A.
Figure 3:
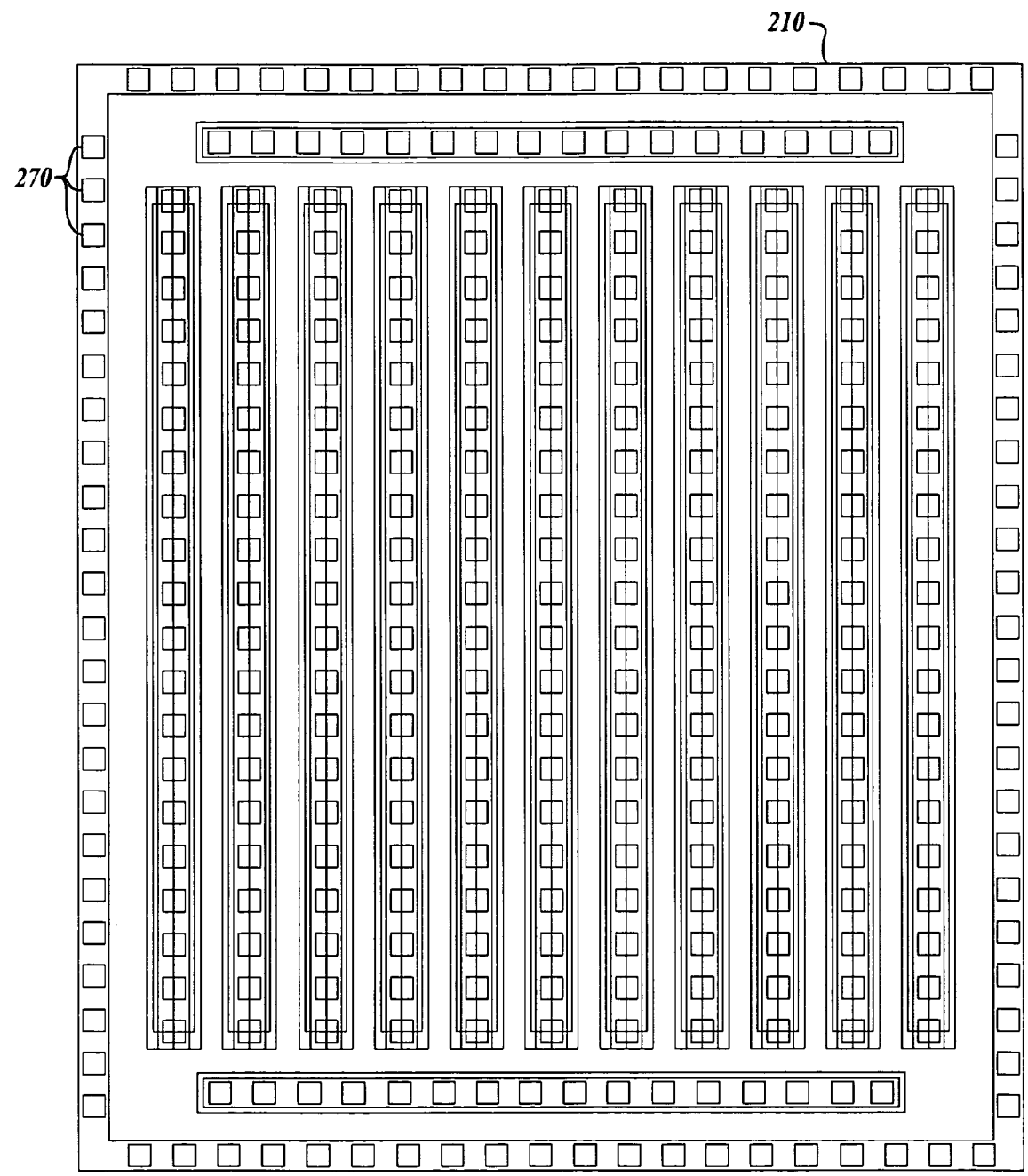
FIG. 3 shows a diagram of an embodiment of the Metal 1 and contact for an embodiment of the NMOS transistor of FIG. 1A.
Figure 4:
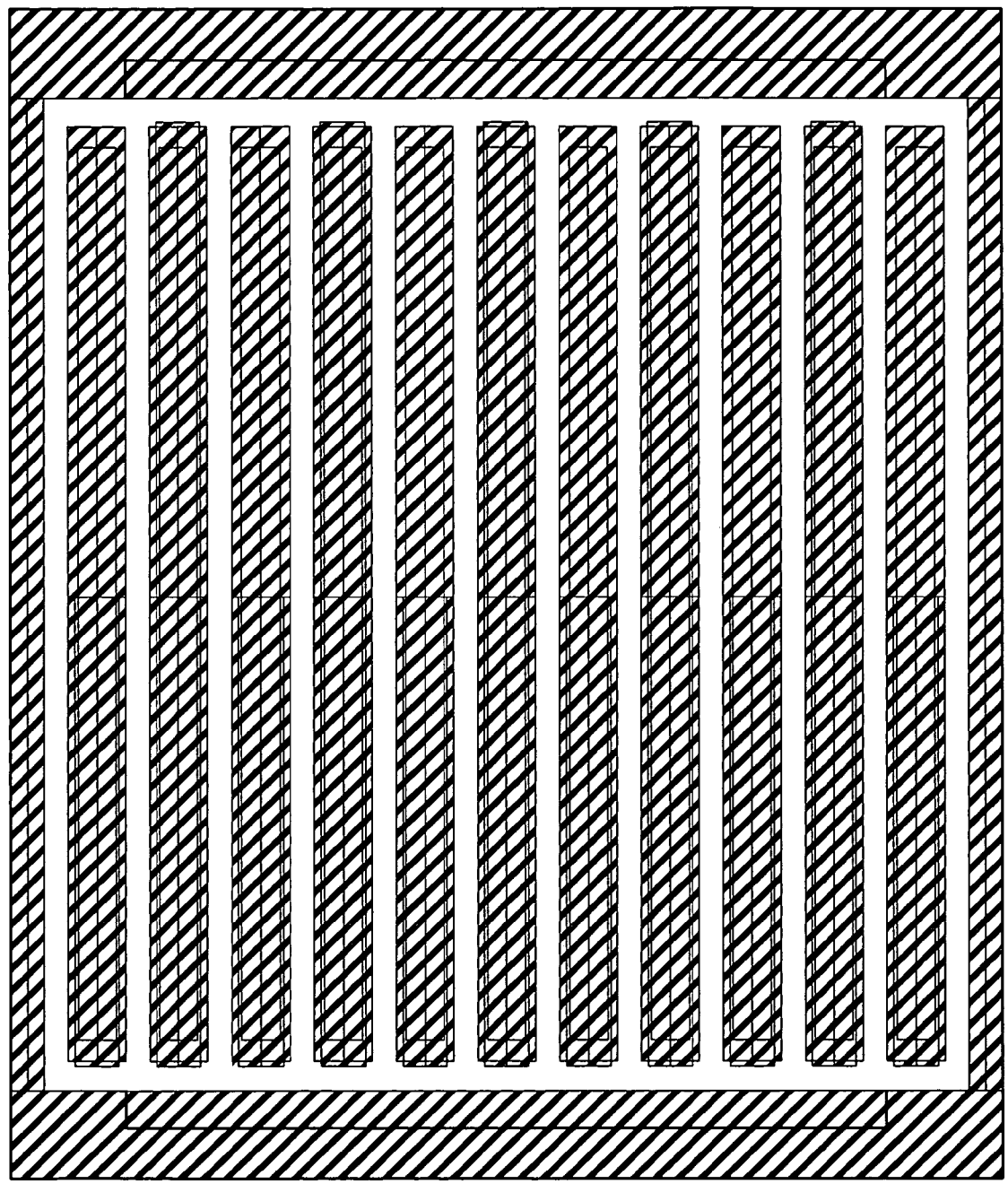
FIG. 4 shows a diagram of an embodiment of the Metal 2 for an embodiment of the NMOS transistor of FIG. 1A.
Figure 5:
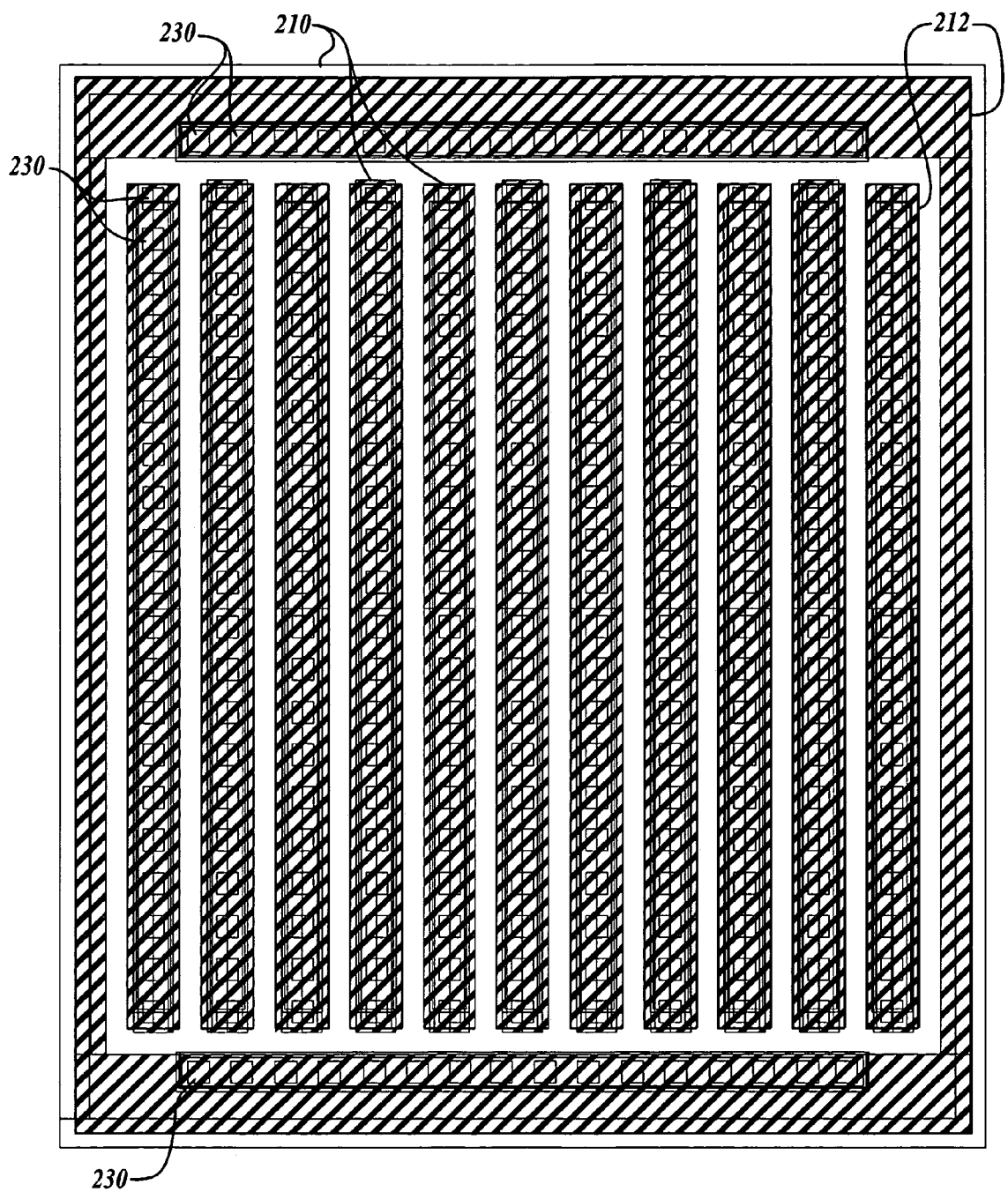
FIG. 5 shows a diagram of an embodiment of the Metal 1, via 1, and Metal 2 for an embodiment of the NMOS transistor of FIG. 1A.
Figure 6:
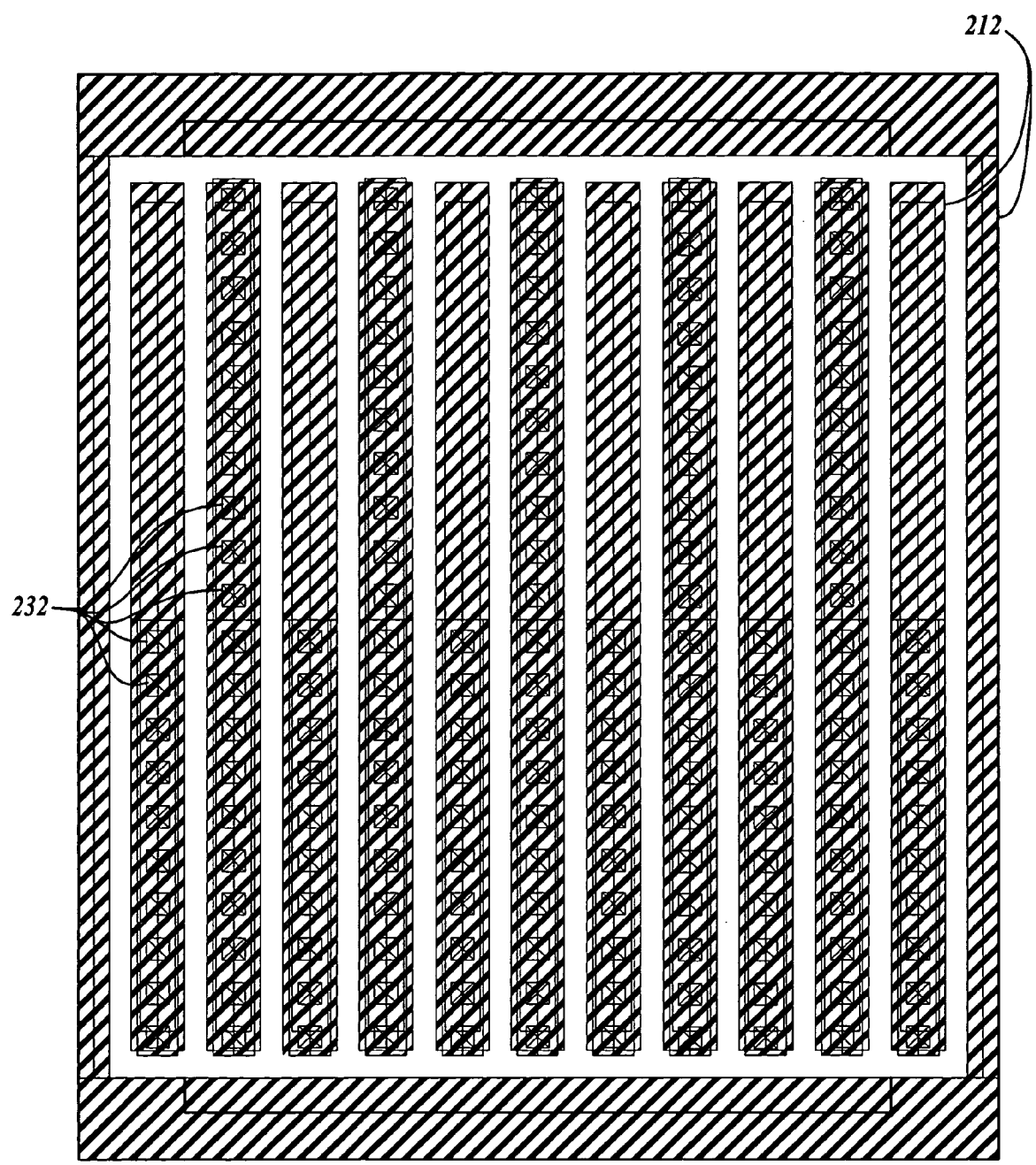
FIG. 6 shows a diagram of an embodiment of the Metal 2 and via 2 for an embodiment of the NMOS transistor of FIG. 1A.
Figure 7:
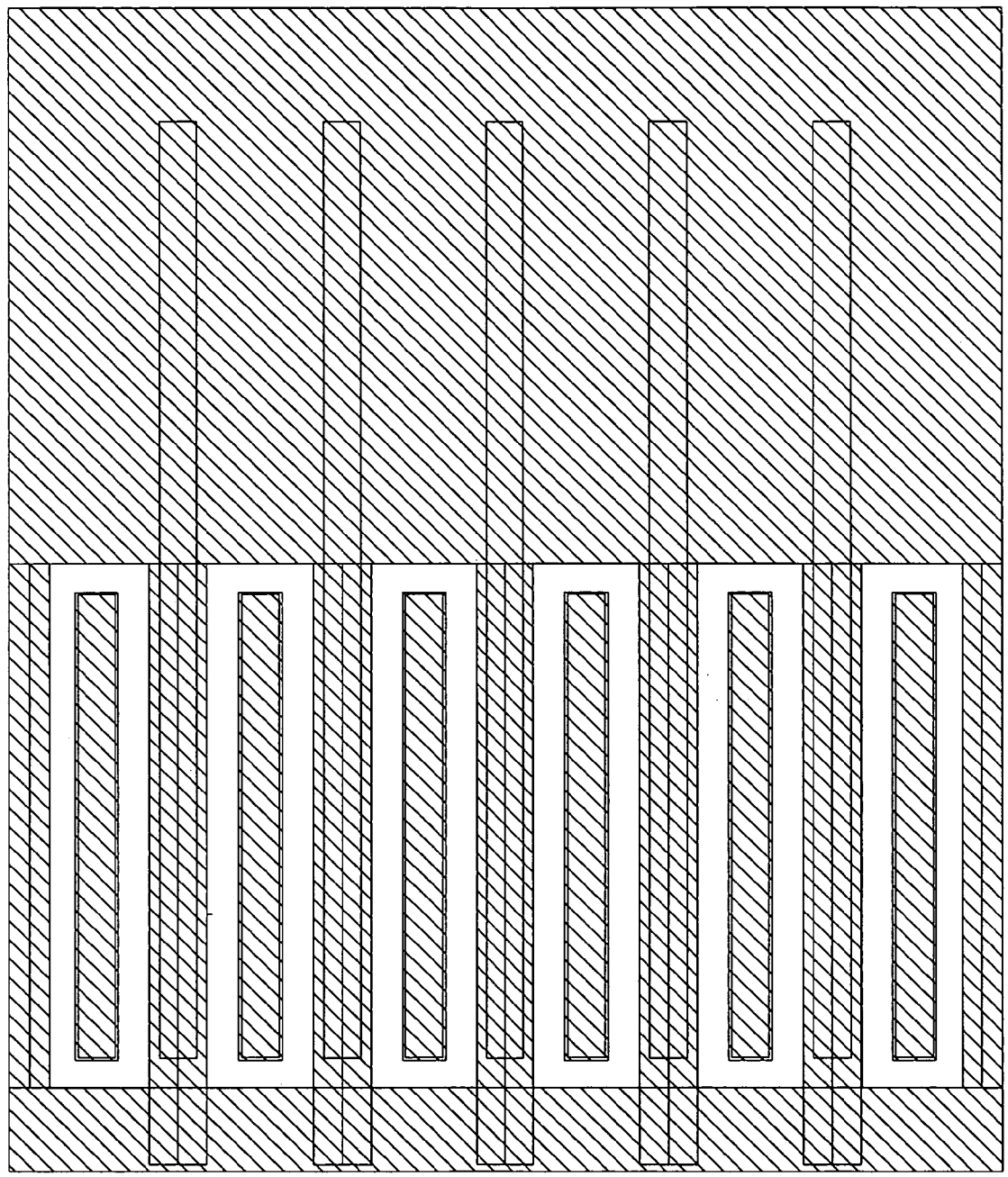
FIG. 7 shows a diagram of an embodiment of the Metal 3 for an embodiment of the NMOS transistor of FIG. 1A.
Figure 8:
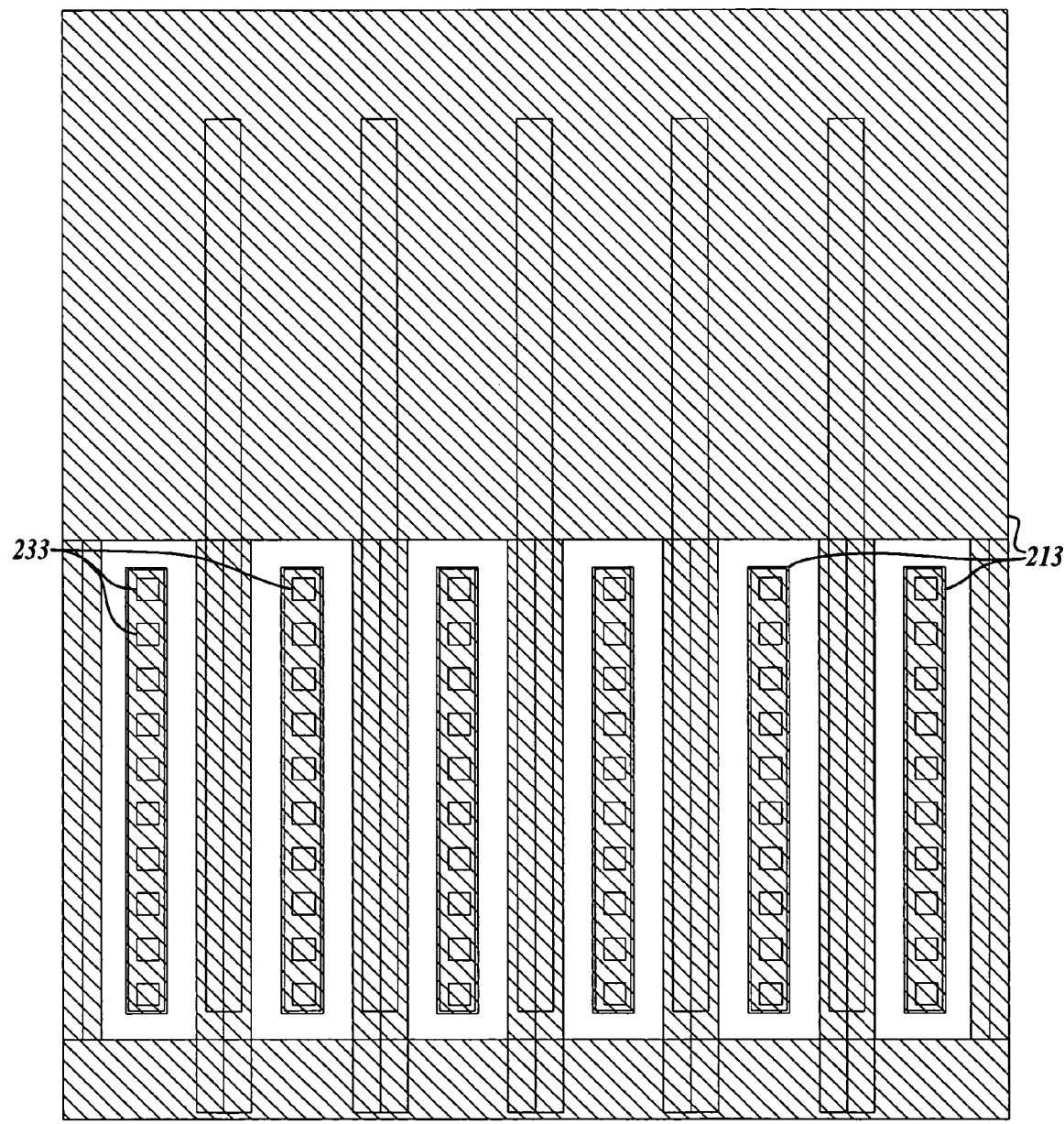
FIG. 8 shows a diagram of an embodiment of the Metal 3 and via 3 for an embodiment of the NMOS transistor of FIG. 1A.
Figure 9:
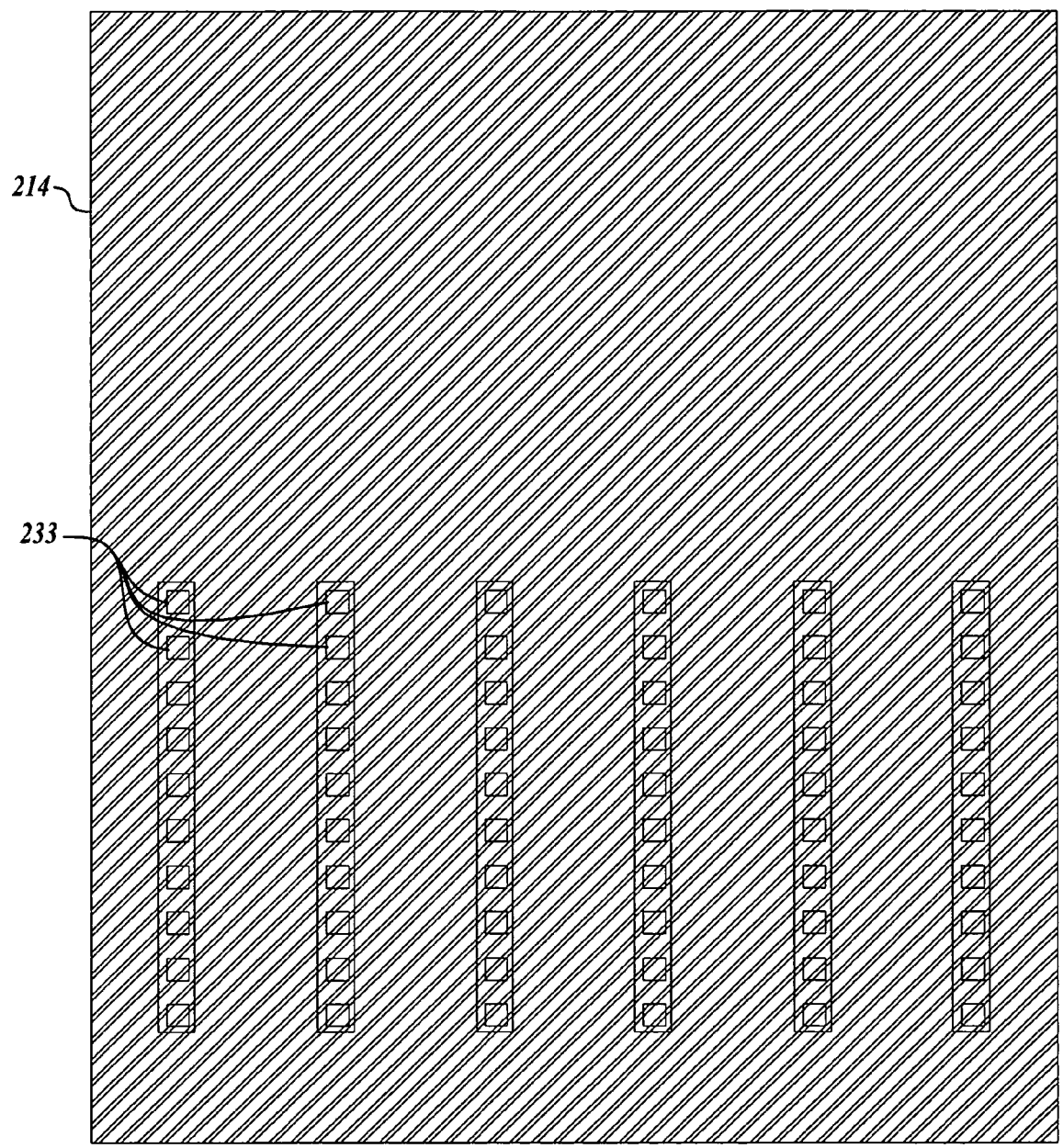
FIG. 9 shows a diagram of an embodiment of the Metal 4 and via 3 for an embodiment of the NMOS transistor of FIG. 1A.
Figure 10:
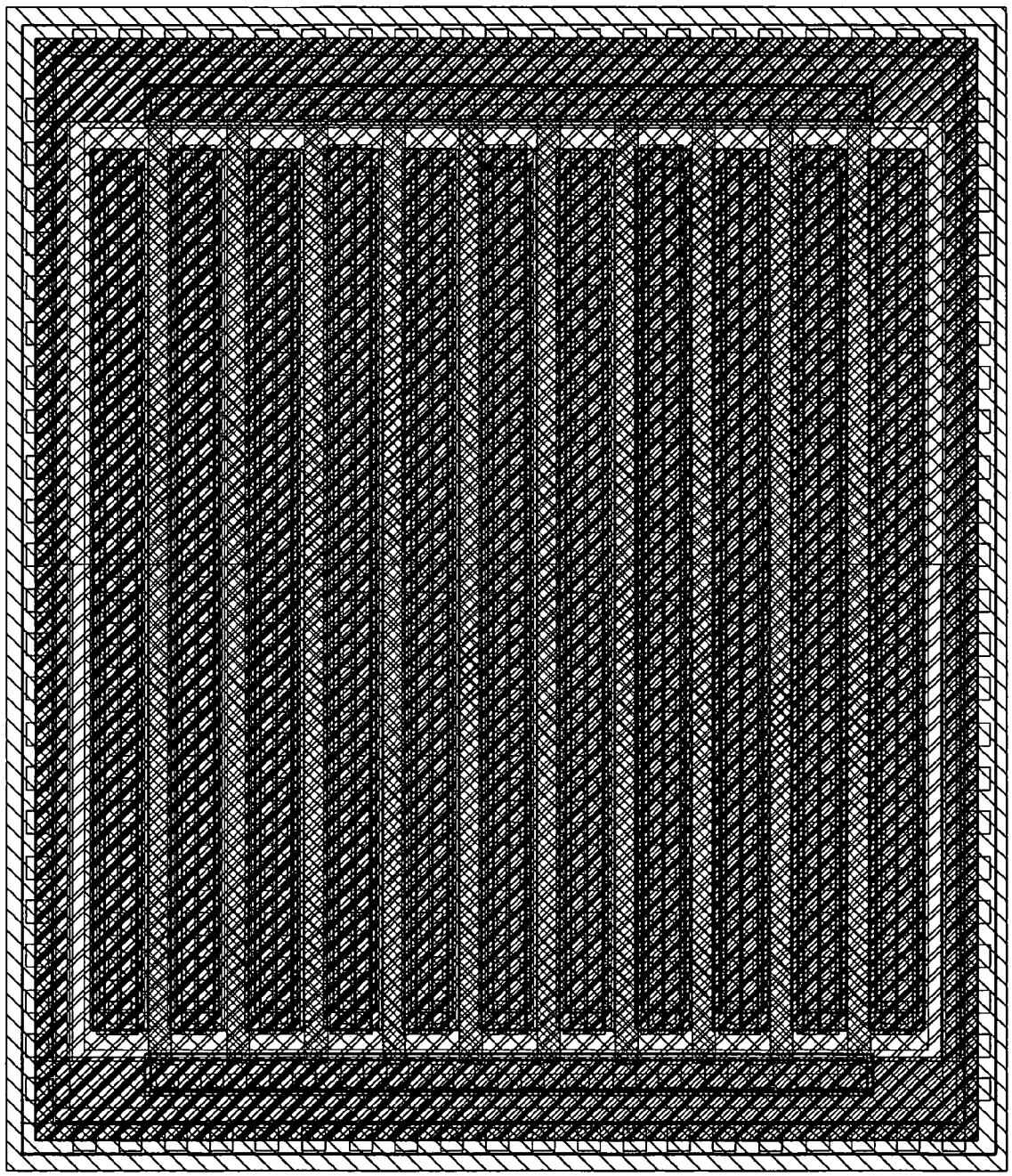
FIG. 10 shows a diagram of an embodiment the NMOS transistor of FIG. 1A combining the details illustrated in FIGS. 2-9 above.

FIGS. 2-9 shows a diagram of an embodiment a layout of NMOS transistor 200, which may be employed as an embodiment of NMOS transistor 100 of FIG. 1A. FIG. 2 shows the Metal 1 (210) and polysilicon (220) for an embodiment of NMOS transistor 200. FIG. 3 shows a diagram of an embodiment of the Metal 1 (210) and contact (270) for an embodiment of NMOS transistor 200. FIG. 4 shows a diagram of an embodiment of the Metal 2 (212) for an embodiment of NMOS transistor 200. FIG. 5 shows a diagram of an embodiment of the Metal 1 (210), via 1 (230), and Metal 2 (212) for an embodiment of NMOS transistor 200. FIG. 6 shows a diagram of an embodiment of the Metal 2 (212) and via 2 (232) for an embodiment of NMOS transistor 200. FIG. 7 shows a diagram of an embodiment of the Metal 3 (213) for an embodiment of NMOS transistor 200. FIG. 8 shows a diagram of an embodiment of the Metal 3 (213) and via 3 (233) for an embodiment of NMOS transistor 200. FIG. 9 shows a diagram of an embodiment of the Metal 4 (214) and via 3 (233) for an embodiment of NMOS transistor 200. FIG. 10 shows a diagram of an embodiment NMOS transistor 200 combining the details illustrated in FIGS. 2-9 above. One embodiment of NMOS transistor 200 is arranged as follows.

FIG. 2 shows the Poly (220) connection for the gate node and the Metal 1 (210) connections for drain/source nodes. Also, the transistor device is surrounded by a Metal 1 (210) ring, which is the bulk connection of transistor 200.

FIG. 3 shows Metal 1 (210) and contact (270), which connect the Metal 1 (210) to all nodes.

FIG. 5 shows the interconnection between Metal 1 (210) and Metal 2 (212) using Via 1 (230). It also shows that the bulk connection is not connected to Metal 2. As shown in FIG. 4 and FIG. 5, Metal 2 (212) surrounds the whole device to connect the gate on both sides of the transistor. The drain/source nodes are also connected to Metal 2 (212). FIG. 4 shows only Metal 2 (212) to show the gate ring around the device.

In the embodiment shown, the Metal 2 (212) ring overlaps the bulk ring half-way, to get connected automatically when using several devices, because the Metal 2 (212) rings will be attached to each other in each needed direction.

FIG. 6 shows how the drain/source nodes are connected from Metal 2 (212) using Via2 (232) to Metal3 (not shown in FIG. 6). As shown in FIG. 6, one of the drain/source nodes has vias over the whole transistor width, and the other node has vias for less than the half width. The reason for this may be seen more clearly in FIG. 7.

As illustrated in FIG. 7, the Metal3 plate (213) overlaps the bulk ring halfway, to get connected automatically when using several devices, because the Metal 3 (213) plates will be attached to each other in each needed direction.

FIGS. 7 & 8 shows that Metal 3 (213) is slotted to bring either the drain or source node up to Metal 4 (not shown in FIG. 8). In the embodiment shown, only the Via 2 interconnections 232 (of FIG. 6), which are over the whole transistor width, can connect to the Metal 3 plate (213). Inside of the Metal 3 (213) slots are separated Metal 3 (213) areas which connect to Metal 4 (214), shown in FIG. 9.

FIG. 8 shows Metal 3 (213) and Via 3 (233). With the interconnection using Via 3 (233) shown, either drain or source are connected to the Metal 4 (214) plate as shown in FIG. 9. The Metal 4 plate (214) overlaps the bulk ring half way, to get connected automatically when using several devices, because the Metal 4 plates (214) of transistor in an array are attached to each other in each needed direction.

In FIG. 10, all layers are shown together to create a whole transistor according to one embodiment of NMOS transistor 200.

Although FIGS. 2-10 illustrate one embodiment of transistor 200, many other embodiments are within the scope and spirit of the invention. For example, although FIGS. 2-10 illustrate an NMOS transistor, in other embodiments, a PMOS transistor, a type of transistor other than a MOSFET, or the like, may be employed. Also, although a particular arrangement for slots in Metal 3 (213) is shown, the slots may be arranged in a different way. For example, the slots could be in the middle of the plate, adjusted 90 degrees from the arrangement shown, or the like.

Figure 11:
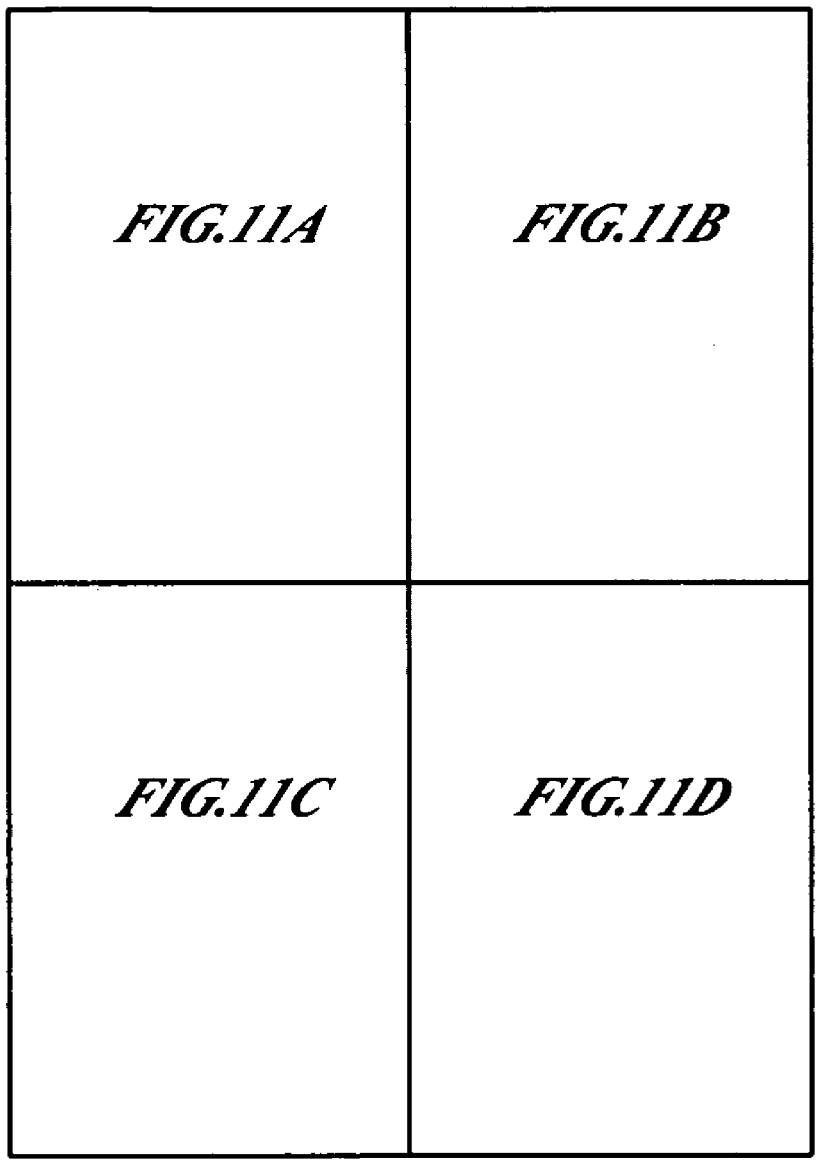
FIG. 11 shows a block diagram of an embodiment of an array of NMOS transistors structured according to the embodiment of an NMOS transistor illustrated in FIG. 10.
Figure 11A:
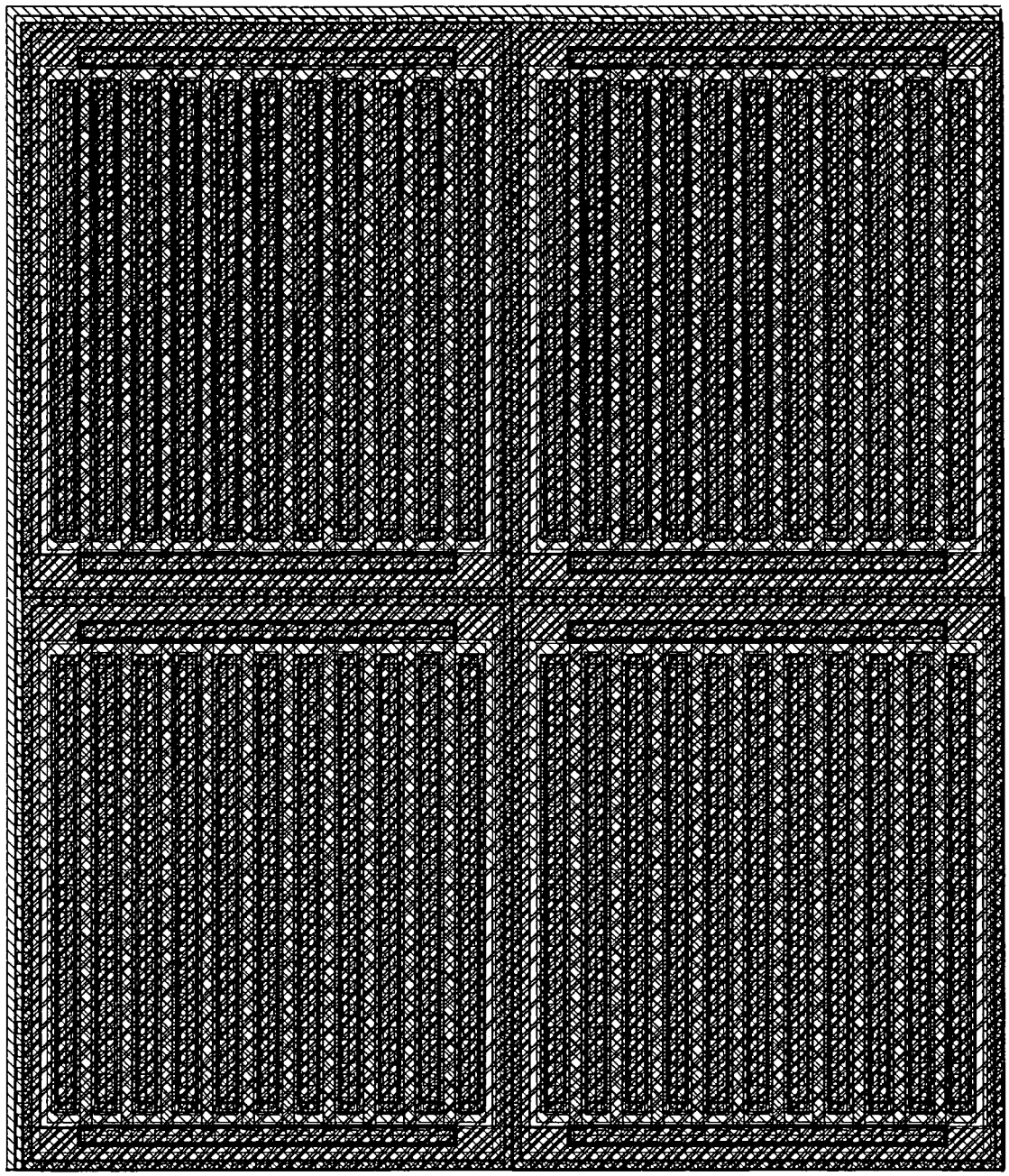
Figure 11B:
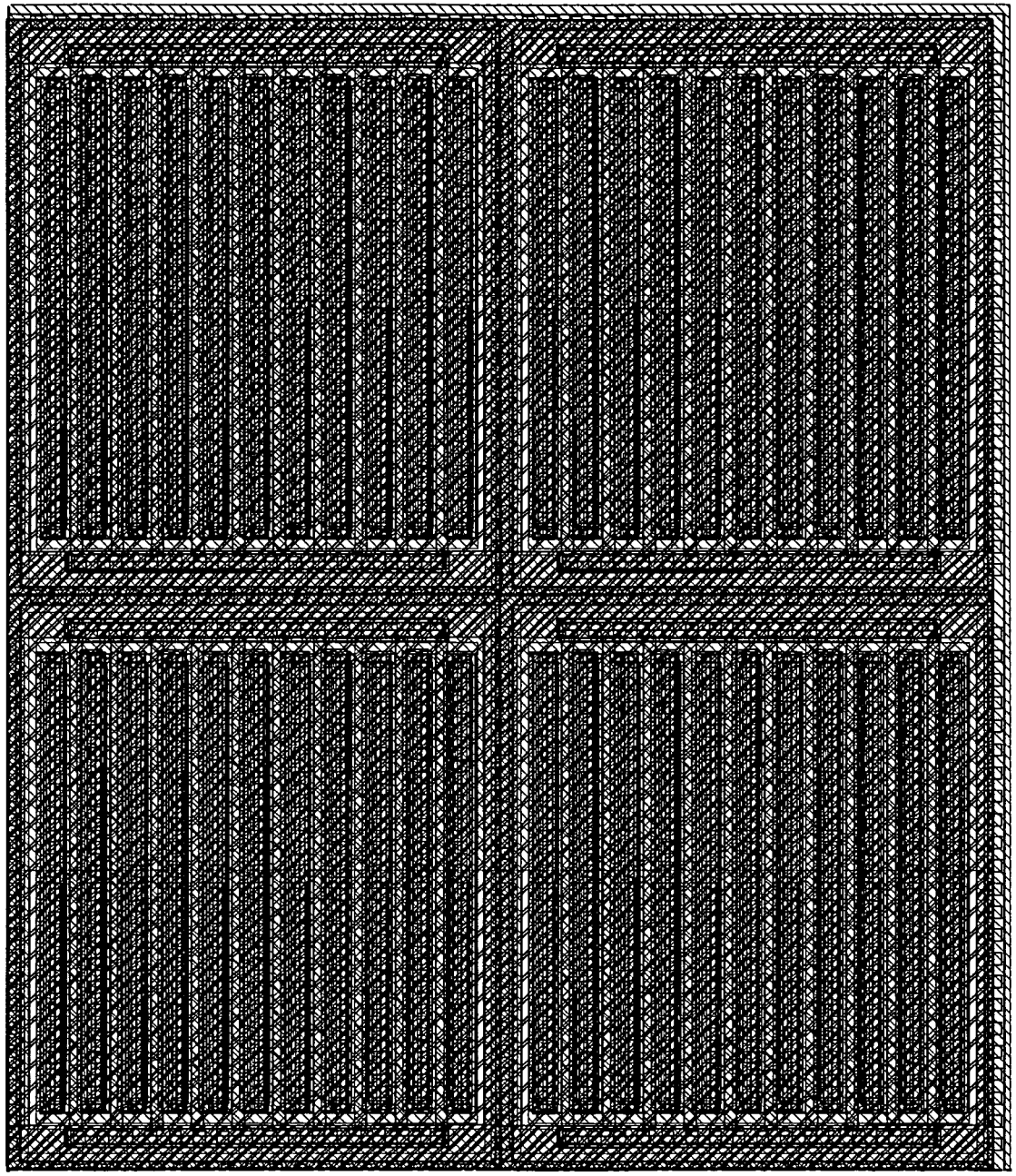
Figure 11C:
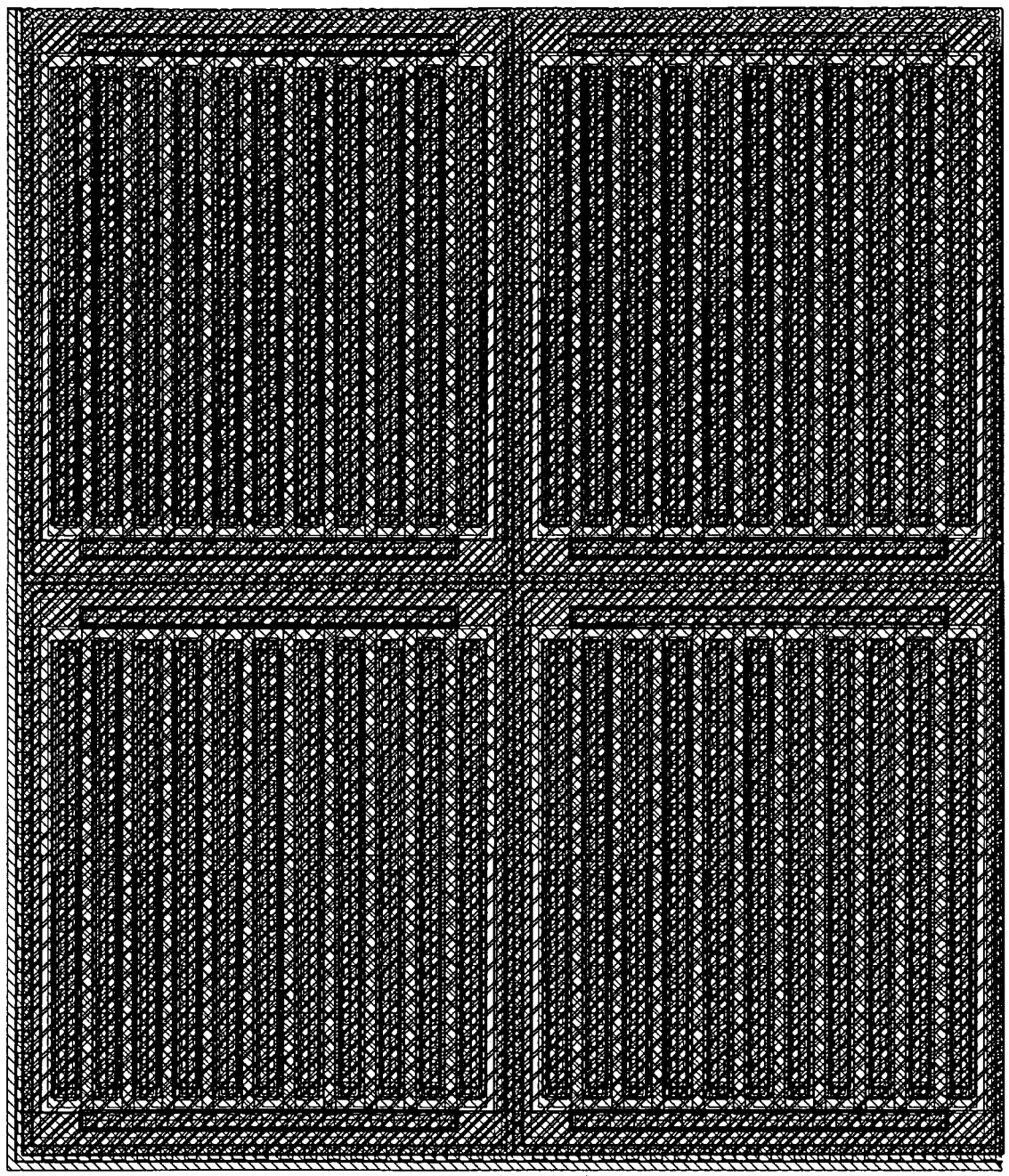
Figure 11D:
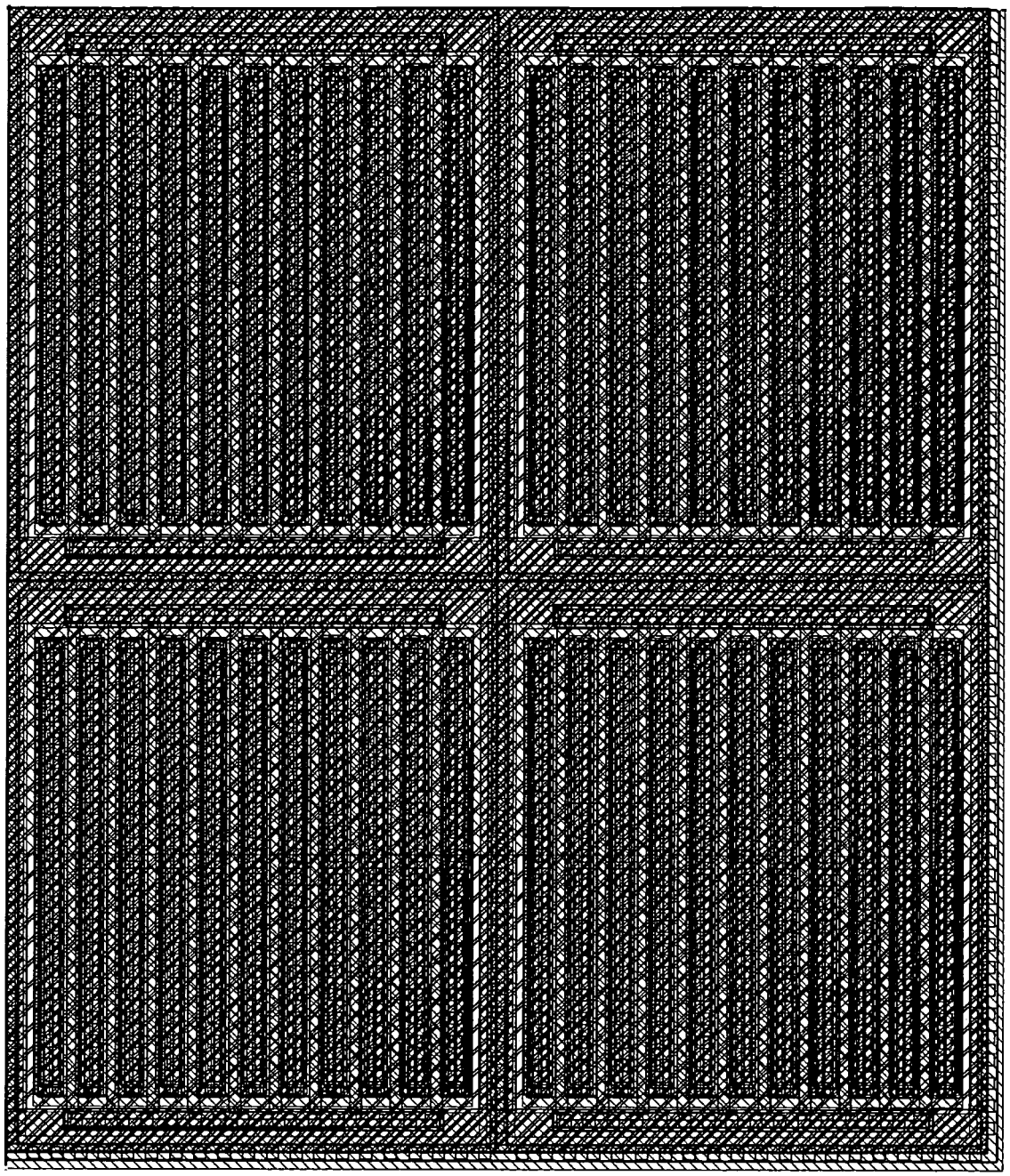

FIG. 11 shows a block diagram of an embodiment of array 1150 of NMOS transistors, wherein each transistor in transistor array 1150 is structured in the same or a similar manner as transistor 200 of FIG. 10.

All nodes (bulk, drain, source, and bulk) are connected with a very low resistance. That is caused by the fact that all nodes are laid out in a checkerboard structure and all nodes are available from each of the 4 directions because they surround the whole transistor each. The whole structure is laid out in a way such that it's relatively simple for the layout engineer to create big transistor arrays without the need of taking care for the interconnections between the transistors. Based on the transistor structure employed, the layout engineer has no need to take care of particular DRC rules like distance between metal layers.

By using array 1150, an engineer may avoid spending a great deal of time to define and find paths for the different interconnections. The structure avoids shorts and false connections automatically. The structure is relatively simple for the layout engineer to use and easy to connect; the layout engineer just has to define which of the two reserved layers are for drain and source. The bulk and the gate connections are already defined by the given layers. In one embodiment, Metal 1 is defined as the layer for the bulk connection, and Metal 2 for the gate of the transistor. The layout engineer defines, for example Metal 3 for drain; then Metal 4 is defined as source automatically (or vice versa). The layout engineer doesn't have to take care about the interconnections inside of transistor array 1150. All connections are given automatically.

Although FIG. 11 shows an example of an array of NMOS transistors, in other embodiments, an array of PMOS transistors may be used instead. Also, although a four by four array of transistors is shown in the embodiment of transistor array 1150 illustrated in FIG. 11, in other embodiments, virtually any number of transistors may be used in the array.

Figure 12:
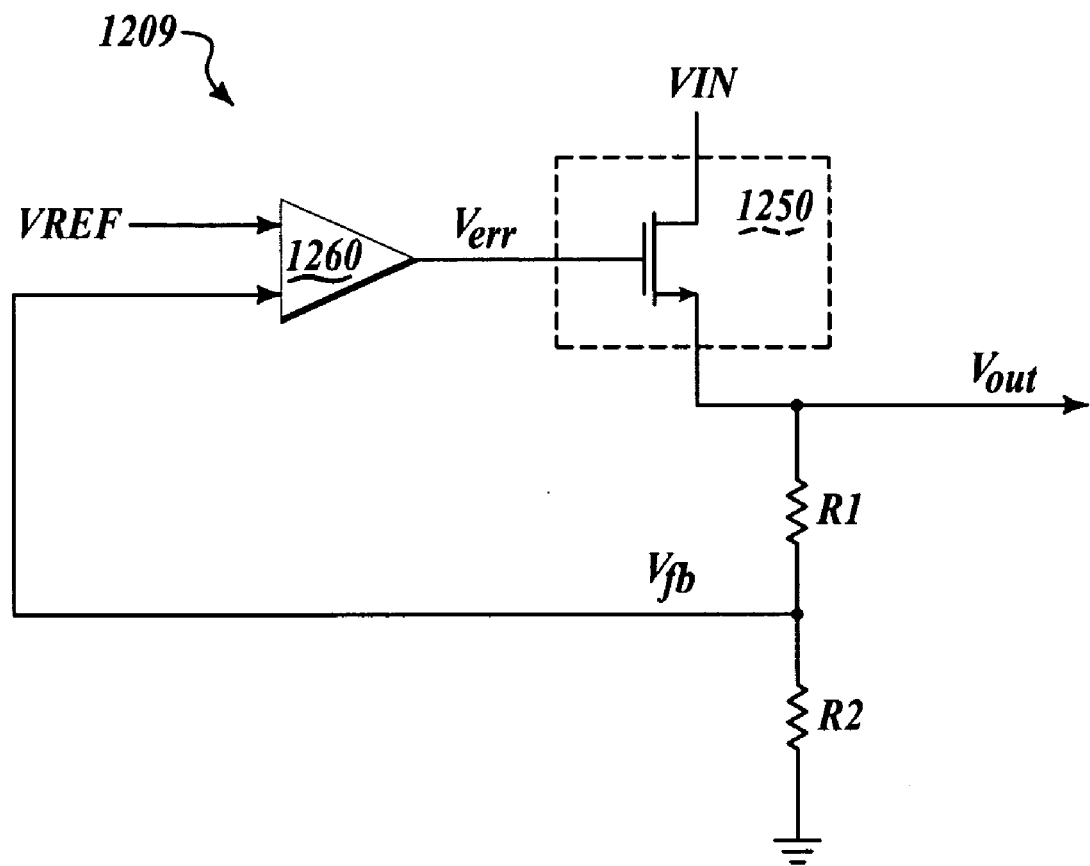
FIG. 12 illustrates a block diagram of an embodiment of a linear regulator that includes an embodiment of the array of FIG. 1, arranged in accordance with aspects of the present invention.

FIG. 12 illustrates a block diagram of an embodiment of linear regulator 1209. Linear regulator 1209 includes error amplifier 1260, resistor R1, resistor R2, and transistor array 1250. Transistor 1150 of FIG. 11 may be employed as an embodiment of transistor array 1250 of FIG. 12.

In operation, error amplifier 1260 provides error voltage Verr from reference voltage VREF and feedback voltage Vfb. Transistor array 1250 operates as a pass device to provide regulated output voltage Vout from input voltage VIN. Resistor R1 and R2 operate as a voltage divider to provide feedback voltage Vfb from voltage Vout.

In one embodiment, transistor array 1209 is a 10-by-20 array of transistors. Each of the transistors in the array has their bulks coupled together, their sources coupled together, their drains coupled together, and their gates coupled together by abutting edges. By employing an array of transistors, the speed of the pass device is significantly increased. Accordingly to one embodiment of the invention, it is relatively simple for the designer to create large output stages by using the structure in a way, that the bulk ring of one device overlaps the next bulk ring(s). In this way all other connections from gate, drain and source are done automatically.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A transistor device laid out in a CMOS process, shaped as a rectangle having four edges, comprising:
   a first drain/source layer that is employable as a source or a drain connection layer; and
   a top drain/source layer that is employable as a source or a drain connection layer, wherein top drain/source layer is above the first drain/source layer, and wherein at least one of the first drain/source layer or the top drain/source layer covers each of the four edges of the device rectangle, such that at least one of the drain or the source is accessible from each of the four edges of the device rectangle.

2. The transistor device of claim 1, wherein the first drain/source layer and the top drain/source layer are both metal layers.

3. The transistor of claim 1, wherein the first drain/source layer is structured such that the first drain/source layer has at least one slot, the first metal layer covers each of the four edges of the device rectangle, and wherein the top drain/source layer covers each of the four edges of the device rectangle.

4. The transistor device of claim 1, further comprising:
   a gate layer that is employable as a gate connection layer; and
   a bulk layer that is employable as a bulk connection layer, wherein the bulk is independently accessible from the drain, the gate, and the source.

5. The transistor device of claim 4, wherein the first drain/source layer, the top drain/source layer, the gate layer, and the bulk layer are all metal layers.

6. The transistor device of claim 5, wherein
   the bulk layer is a Metal 1 layer that is below the gate layer, the first drain/source layer, and the top drain/source layer;
   the gate layer is a Metal 2 layer that is below the first drain/source layer and the top drain/source layer; and
   wherein the first drain/source layer is a Metal 3 layer that is below the top drain/source layer.

7. The transistor device of claim 1, wherein the transistor device is a transistor array including a plurality of transistors; the first drain/source drain layer is connected to the drain or the source of each transistor of plurality of transistors; the top drain/source layer is connected to the drain or the source of each of the plurality of transistors; each transistor in the plurality of transistors is shaped as a rectangle having four edges; each of the transistors in the plurality is structured such that any two transistors having any two edges abutting each other automatically have their gates, drains, sources, edges, and bulks coupled together; and wherein, for each of the transistors in the plurality, at least one edges of the transistor is abutted to the edges of at least one of the edges of another of the transistors in the plurality of transistors.

8. The transistor device of claim 1, further comprising:
a bulk layer including a bulk ring, wherein at least one of the first drain/source layer or the top drain/source layer overlaps the bulk ring by at least 50%.

9. A transistor device laid out in a CMOS process, shaped as a rectangle having four edges, comprising:
a substrate;
a first diffusion region employable as a drain or source region;
a second diffusion region employable as a drain or source region, wherein a channel region is present between the first diffusion region and the second diffusion region;
an insulator that is coupled to the channel region;
a conductor that is coupled to the insulator;
a first metal layer, including:
  a bulk portion that is connected to the substrate, wherein the bulk portion covers each of the four edges of the device rectangle such that the bulk is accessible from each of the four edges of the device rectangle;
  a gate portion that is connected to conductor;
  a first drain/source portion that is connected to the first diffusion region; and
  a second drain/source portion that is connected to the second diffusion region;
a second metal layer, including:
  a gate portion that is connected to the gate portion of the first metal layer, wherein the portion of the second metal layer that is connected to the gate portion of the first metal layer covers each of the four edges of the device rectangle such that the gate is accessible from each of the four edges of the device rectangle;
  a first drain/source portion that is connected to the first diffusion region; and
  a second drain/source portion that is connected to the second diffusion region;
a third metal layer, including:
  a first drain/source portion that is connected to the first diffusion region, wherein the first drain/source portion is structured to have a plurality of slots, and wherein the first drain/source portion covers all of the device rectangle except for the plurality of slots;
  a second drain/source portion that is connected to the second diffusion region, wherein the second drain source region includes a plurality of regions, each of which is included within a separate one of the plurality of slots; and
a fourth metal layer covering approximately the entire device rectangle, wherein the fourth metal layer is connected to the second drain/source portion of the third metal layer.

10. The transistor device of claim 9, wherein the first metal layer, the second metal layer, the third metal layer, and the fourth metal layer each include a ring portion, and wherein the ring portions of the second, third, and fourth metal layers each overlap the ring portion of the first metal layer by at least 50%.

11. The transistor of claim 9, wherein the first drain/source portion of the second metal layer includes a plurality of transistor stripes, the second drain/source portion of the second metal layer further includes another plurality of transistor stripes that alternate between each of the plurality of transistor stripes in the first drain/source portion of the second metal layer, and wherein the transistor device further comprises:
a plurality of vias that connect the first drain/source portion of the second metal layer to the first drain/source portion of the third metal layer, wherein the plurality of vias span about half of the width of each of the plurality of transistor stripes in the first drain/source portion of the second metal layer; and
another plurality of vias that connect the first drain/source portion of the second metal layer to the first drain/source portion of the third metal layer, wherein said another plurality of vias span most of the width of each of said another plurality of transistor stripes.

12. The transistor device of claim 11, wherein the plurality of transistor stripes includes at least three transistor stripes, and wherein said another plurality of transistor stripes includes at least three transistor stripes, whereby the transistor device includes at least six transistor stripes.

13. The transistor device of claim 11, wherein the plurality of transistor stripes includes at least five transistor stripes, and wherein said another plurality of transistor stripes includes at least five transistor stripes, whereby the transistor device includes at least ten transistor stripes.

14. The transistor device of claim 9, wherein the transistor device is a transistor array including a plurality of transistors; each of the transistors in the plurality of transistors is shaped as a rectangle having four edges; the first, second, third, and fourth metal layers each have at least a ring portion for each transistor in the plurality of transistors; each transistor in the plurality is structured such that any two transistors having any two edges abutting each other automatically have their bulks coupled together via the ring portion of first metal layer; each of the transistors in the plurality is structured such that any two transistors having any two edges abutting each other automatically have their gates coupled together via the ring portion of second metal layer; each of the transistors in the plurality is structured such that any two transistors having any two edges abutting each other automatically have their drains and sources coupled together via the ring portions of third and fourth metal layers; and wherein, for each of the transistors in the plurality, at least one edges of the transistor is abutted to the edges of at least one of the edges of another of the transistors in the plurality of transistors.

15. An integrated circuit, comprising:
a transistor array including a plurality of transistors, wherein each of the plurality of transistors includes a drain, a source, a gate, and a bulk; each of the transistors in the plurality of transistors is shaped as a rectangle having four edges; each of the transistors in the plurality is structured such that any two transistors having any two edges abutting each other automatically have their gates, drains, sources, edges, and bulks coupled together; and wherein, for each of the transistors in the plurality, at least one edges of the transistor is abutted to the edges of at least one of the edges of another of the transistors in the plurality of transistors.

16. The integrated circuit of claim 15, further comprising:
an error amplifier that is operable to provide an error voltage based on a feedback voltage and a reference voltage; wherein the feedback voltage is based, in part, on a regulated output voltage; the transistor array is arranged to operate as a pass device that provides the regulated output voltage from an input voltage; and wherein the gate of each of the transistors in the transistor array is operable to receive the error voltage.

17. The integrated circuit of claim 15, wherein the transistor array is arranged as a checkerboard structure.

18. The integrated circuit of claim 15, wherein each of the transistors in the transistor array is an NMOSFET.

19. The integrated circuit of claim 15, wherein each of the transistors in the transistor array is a PMOSFET.

20. The integrated circuit of claim 15, wherein the transistor array includes a top metal layer, wherein the top metal layer is a plate that covers the top of approximately the entire transistor array, and wherein the top metal layer is employable as the source or the drain of each of the transistors in the plurality.

21. The integrated circuit of claim 20, wherein the transistor array further includes a slotted metal layer, the slotted metal layer includes a plurality of slots, the slotted metal layer covers approximately all of the area of the transistors except for the plurality of slots, and wherein the slotted metal layer is employable as the source or the drain of each of the transistors in the plurality.

22. The integrated circuit of claim 21, wherein
for each transistor in the plurality of transistors, the slotted metal layer includes at least two slots.

23. The integrated circuit of claim 15, wherein each of the transistors in the transistor array is laid out according to a four-metal CMOS process, wherein each of the transistors includes a first metal layer that is employable as a bulk connection, a second metal layer that is employable as a gate connection, a third metal layer than is employable interchangeably as a drain or source connection, and a fourth metal layer than is employable interchangeably as a source or drain connection.

24. The integrated circuit of claim 23, wherein each of the four metal layers includes a ring that surrounds that transistor such that each of the four metal layers is accessible from all four edges of the device rectangle.

25. The integrated circuit of claim 15, wherein
each transistor of the plurality of transistors includes: a bulk ring surrounding the transistor.

26. The integrated circuit of claim 25, wherein
each transistor of the plurality of transistors includes: a drain/source metal layer that is employable interchangeably as a drain or source connection, and a source/drain metal layer that is employable interchangeably as a source or drain connection, wherein, for each transistor in the plurality of transistors, at least one of the drain/source metal layer or the source/drain metal layer includes a ring that surrounds the transistor.

27. The integrated circuit of claim 25, wherein
each transistor of the plurality of transistors includes: a drain/source metal layer that is employable interchangeably as a drain or source connection, and a source/drain metal layer that is employable interchangeably as a source or drain connection, wherein, for each transistor in the plurality of transistors, at least one of the drain/source metal layer or the source/drain metal layer includes a ring that surrounds the transistor and overlaps the bulk ring by at least 50%.

* * * * *

UNITED STATES PATENT AND TRADEMARK OFFICE
CERTIFICATE OF CORRECTION

| | |
|---|---|
| PATENT NO. | : 7,355,217 B1 |
| APPLICATION NO. | : 11/285764 |
| DATED | : April 8, 2008 |
| INVENTOR(S) | : Brand |

It is certified that error appears in the above-identified patent and that said Letters Patent is hereby corrected as shown below:

In column 1, line 66, delete "FIG. 1," and insert -- FIG. 11, --, therefor.

Signed and Sealed this

Eighth Day of July, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,355,217 B1 |
| APPLICATION NO. | : 11/285764 |
| DATED | : April 8, 2008 |
| INVENTOR(S) | : Brand |

Page 1 of 1

It is certified that error appears in the above-identified patent and that said Letters Patent is hereby corrected as shown below:

In column 1, line 66, delete "FIG. 1," and insert -- FIG. 11, --, therefor.

Signed and Sealed this

Seventeenth Day of February, 2009

JOHN DOLL
*Acting Director of the United States Patent and Trademark Office*